United States Patent
Suan et al.

(10) Patent No.: US 6,724,440 B1
(45) Date of Patent: Apr. 20, 2004

(54) TUNING APPARATUS FOR A FREQUENCY SYNTHESIZER TUNER

(75) Inventors: Pang Kim Suan, Singapore (SG); Tey Tiam Fatt, Singapore (SG)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 09/294,157

(22) Filed: Apr. 19, 1999

(30) Foreign Application Priority Data

Apr. 22, 1998 (GB) .............................................. 9808615

(51) Int. Cl.$^7$ ................................................ H04N 5/50
(52) U.S. Cl. ........................ 348/731; 348/719; 348/732; 455/260; 331/179; 327/156
(58) Field of Search ................................ 348/719, 731, 348/732, 733, 735, 737; 455/260; 331/17, 20, 25, 179; 327/156, 157, 158, 159; H04N 5/50

(56) References Cited

U.S. PATENT DOCUMENTS

| | | | | |
|---|---|---|---|---|
| 4,451,850 A | * | 5/1984 | Kamemoto | .................. 348/731 |
| 4,661,995 A | | 4/1987 | Kashiwagi | |
| 4,901,036 A | | 2/1990 | Herold et al. | |
| 5,552,838 A | * | 9/1996 | Suizu | .................. 348/732 |
| 5,937,338 A | * | 8/1999 | Tomita | .................... 455/161.2 |
| 6,177,964 B1 | * | 1/2001 | Birleson et al. | ............ 348/725 |

FOREIGN PATENT DOCUMENTS

GB 2194696 * 3/1988

WO WO91/02418 * 2/1991

OTHER PUBLICATIONS

Scheckel and Krieger: "1.3 GHz Phase–Locked Loop with IIC Bus", Siemens Forschings–und Entwicklungsberichte, vol. 15, No. 2, 1986, pp. 73–77, XP002108453, Springer Verlag. Berlin., DE ISSN:0370–9736.

European Search Report Citing the above–listed references AA, AB and AR.

* cited by examiner

*Primary Examiner*—John Miller
*Assistant Examiner*—Brian Yenke
(74) *Attorney, Agent, or Firm*—Joseph S. Tripoli; Kuniyuki Akiyama

(57) ABSTRACT

A tuner for receiving a video broadcast signal comprises commendable circuits (6, 7, 8, 17) to select a tuned frequency, the tuner comprising a bus interface (21) receiving data bytes and among those data bytes, bytes representing a divider ratio N, and address bytes. Bytes received by the bus interface (21) are processed through a N divider comparator (23) comparing the value of divider ratio N received from the bus interface (21) to values stored in a register (24), the comparator (23) outputting address bytes and data bytes to be sent to the commendable circuit (6, 7, 8, 17) of the tuner to select a band and a tuned frequency. The tuner may be implemented on a chassis of a receiver without modification of an existing software included with a microprocessor of the chassis. The values stored in the register (24) are customized values of the tuner.

7 Claims, 2 Drawing Sheets

TUNING APPARATUS FOR A FREQUENCY SYNTHESIZER TUNER

FIELD OF THE INVENTION

This invention relates to tuning apparatus for a frequency synthesiser tuner and, more particularly for such tuner used in television receiver or video cassette recorder or video satellite receiver or consumer set top box.

BACKGROUND OF THE INVENTION

As the input stage to a television receiver, the tuner provides the primary role of selecting the desired signal and excluding all others. The tuner typically provides a 9-Mhz passband for the 6-Mhz channel. This passband is usually achieved by four tuned circuits: a single-tuned input filter located between the antenna input and the RF amplifier, a double-tuned band pass filter located between the RF amplifier and mixer stages, and a single-tuned intermediate frequency (IF) circuit at the output of the mixer. The first three are frequency-selective to the desired channel by varying their inductance, capacitance, or both. The partition of the VHF or UHF or hyperband, band between those stages is not standard and varies according to each maker of tuner. The mixer output is always tuned to the IF frequency of 45;75 or 38.9 Mhz according to the standard of the received broadcast signal.

The selectivity provided by the RF stage is to reduce or eliminate undesired signals from the desired channel, e.g., image, thereby eliminating or reducing interference problems.

In a typical tuner, such as tuner for receiving broadcast television signals which are transmitted over respective broadcast frequencies, the tuning condition of the tuner is determined by the frequency of the local oscillating signal which is mixed with the received broadcast frequencies to produce a predetermined intermediate frequency (IF) signal. The IF signal is then demodulated to get the video and audio broadcast signals. As the local oscillating frequency is changed, the tuner is tuned to different broadcast frequencies to receive the program information which is broadcast thereover. Typically, a local oscillator includes a variable capacitor or inductance which, when value thereof varies, the local oscillating frequency correspondingly varies. By adjusting for instance, an inductance coil, an operator may change the local oscillating frequency as desired and, thus, may establish any desired tuning condition of the tuner.

The variable capacitor is generally constructed as a variable capacitance diode, whose capacitance value is determined by a control tuning voltage ($v_t$) applied thereto. Since the same control voltage will result in the same tuning condition, tuners are known in which digital techniques are relied upon for storing digital representations of respective control voltages, which digital representations can be retrieved, as desired, so as to establish a capacitance value rapidly which would tune the tuner to a desired broadcast frequency.

Presently, a so-called frequency synthesizer tuner has been widely used, in which the local oscillating signal is generated by a phase-locked loop under the control of a digital frequency-selecting signal. In such a phase-locked loop, a variable frequency oscillator produces the local oscillating signal. In addition to being supplied to the usual mixer in the tuner, the local oscillating signal is supplied through a programmable frequency divider to a phase comparator where it is compared to a reference oscillating signal. Any phase difference therebetween results in an error signal which is fed back to the oscillator by tuning voltage, so as to adjust the frequency of the local oscillating signal and thereby adjust the tuning condition of the tuner. If the dividing ratio of the frequency divider changes, the frequency-divided oscillating signal which is supplied to the phase comparator will change. By well-known phase-locked loop operation, this changes the basic frequency of the local oscillating signal, resulting in cancelling the phase error signal.

In present television broadcast receiver the control of the tuning frequency is made via a microprocessor. The microprocessor send to the tuner on a bus various data bytes including for instance two bytes to settle the value of the divider and other bytes to control connection to be established in the tuner. Such tuner are generally made with a mixer-oscillator and phase lock loop integrated circuit. In addition to change in the divider value the control microprocessor must send additional information so that the first frequency-selective stages and outputs of the tuners will be settled according to the particular features of the tuner included in the television broadcast receiver. Such bytes are processed in the integrated circuit tuner through a bus interface. Each tuner of particular manufacturers, as explained above, is made with particular frequency band splitting so that according to the frequency chosen by the user, connection in the circuit will be made a particular way and outputs of the tuners will be available on one terminal or an other of the integrated circuit tuner. In spite of the fact that there is now a so-called "World Standard Pining Frequency Synthesiser tuner", in which the size of the box and the connection pins are standardised, one integrated circuit tuner is not readily interchangeable with a circuit of an other manufacturer. To use alternative FST (Frequency Synthesiser Tuner) Tuner for the receiver chassis without any change in software tuning is not possible for most (all) of the application today. The software included in a microprocessor that controls the Tuner must include information like band partition of the tuner, reference divider, control byte of the tuner integrated circuit. Therefore, it is necessary in case of a change of the type of tuner, in particular if a tuner of another maker is used to change the software, and that is a serious drawback for the new incomer on the market of tuners.

The present invention seeks to provide improved tuning apparatus.

SUMMARY OF THE INVENTION

According to an aspect of the present invention, there is provided a tuner for receiving a video broadcast signal, the tuner comprising commandable circuits operable to select a tuned frequency, the tuner comprising a bus interface operable to receive data bytes and among those data bytes, bytes representing a divider ratio N and address bytes, wherein bytes received by the bus interface are processable through a N divider comparator operable to compare the value of divider ratio N received from the bus interface to values stored in a register, said comparator being operable to output control bytes and data bytes to be sent to the commandable circuit of the tuner to select a tuned frequency.

The preferred embodiment takes advantage of the fact that all tuners dedicated to a region have the same frequency ranges and the same intermediate frequency. So that the divider to get a desired frequency is the same for most of the tuners. What differs from one type of tuner to another is the frequency band partition in the RF stages. So according to the preferred embodiment, when existing software data from any of the already existing Frequency Synthesiser Tuner, is received at input of the bus transceiver with correct address bytes information, divider data byte 1 & 2 will be transferred to a N divider logic table comparator. It is to be noted that generally the divider ratio is given in two bytes, allowing for a divider ratio between 32767 and 256. The comparator inputs the divider data and outputs all other necessary data bytes taking in account the particular technical features of the tuner in which the comparator is included. The comparison will provide all necessary output information to complete the frequency synthesiser tuning functions:

a) Frequency bandswitch (usually>2 Bandswitch) & output port information b) Frequency N divider value c) Self generated control byte information. (The external control byte information coming from the microprocessor of the receiver via an IC Bus is no more required.)

As such, the output ports and control byte coming from the microprocessor through an IC bus can be ignored.

There are several advantages using this "UTS" Frequency Synthesiser Tuner:

1) Fully compatible World Standard Frequency Synthesiser Tuner in pining and software is achieved, and provide "plug-and-play" possibility.

2) Great flexibility in tuner design to achieve best optimised performance in frequency band partitions and selection of integrated circuit without constraints from keeping tuning software compatibility.

3) Most of the existing or old tuning software can still be used with tuner equipped with this universal tuning synthesiser ("UTS").

4) Enormous benefit to Tuner user in application, performance & cost.

5) Facilitate after sale servicing on FST (replacement or upgrading), just as convenient like a VST (voltage synthesizer Tuning) tuner.

6) Allow the feasible development of build-in standard FST tuning protocole into microprocessor (control of the instrument) directly as functional feature to control tuner without any additional written software for FST.

BRIEF DESCRIPTION OF THE DRAWINGS

An embodiment of the present invention is described below, by way of example only, with reference to the accompanying drawings, in which.

DETAILED DESCRIPTION OF PREFERED EMBODIMENT

Figure 1:
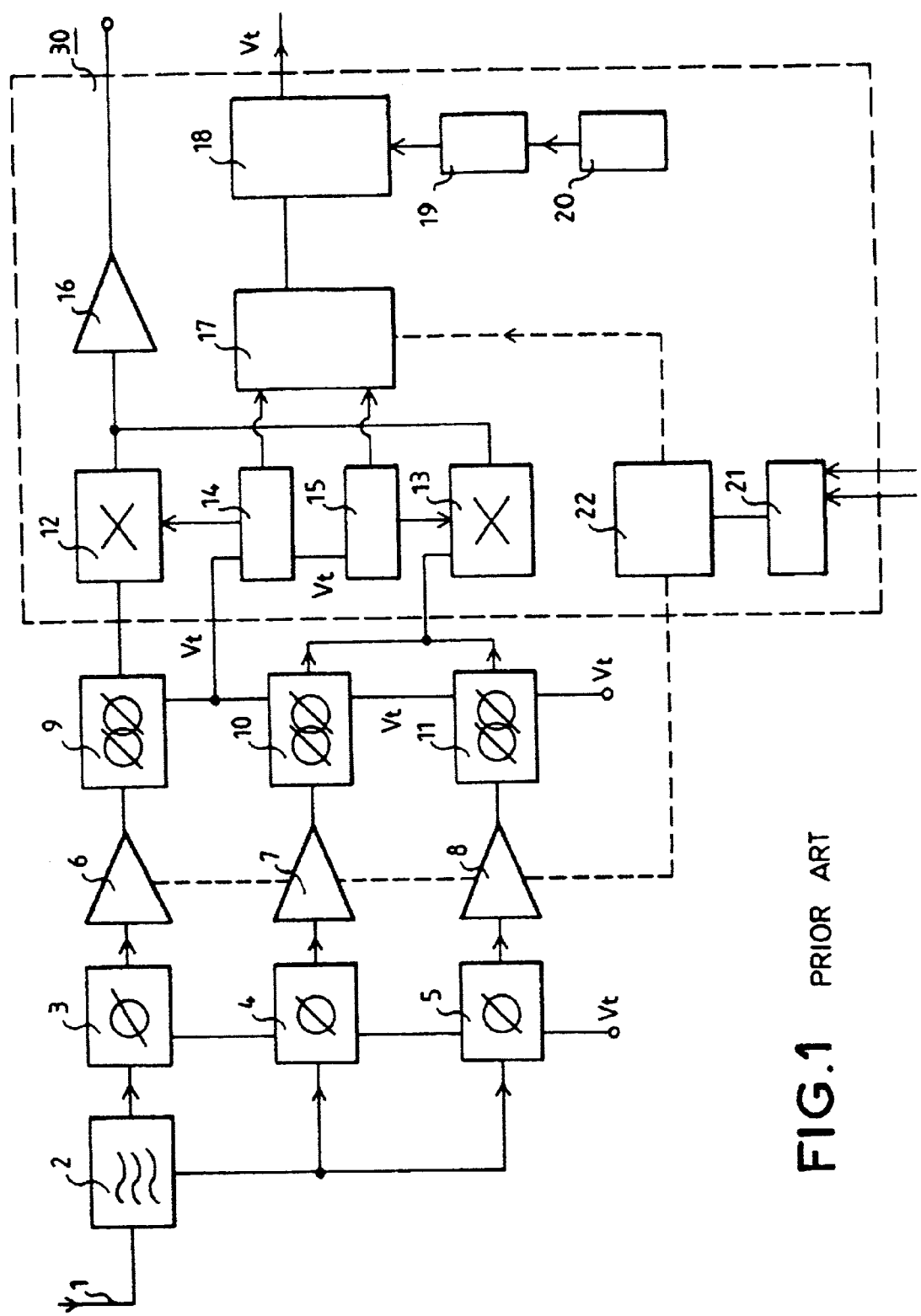
FIG. 1 is a block diagram of a tuner section according to prior art.
Figure 2:
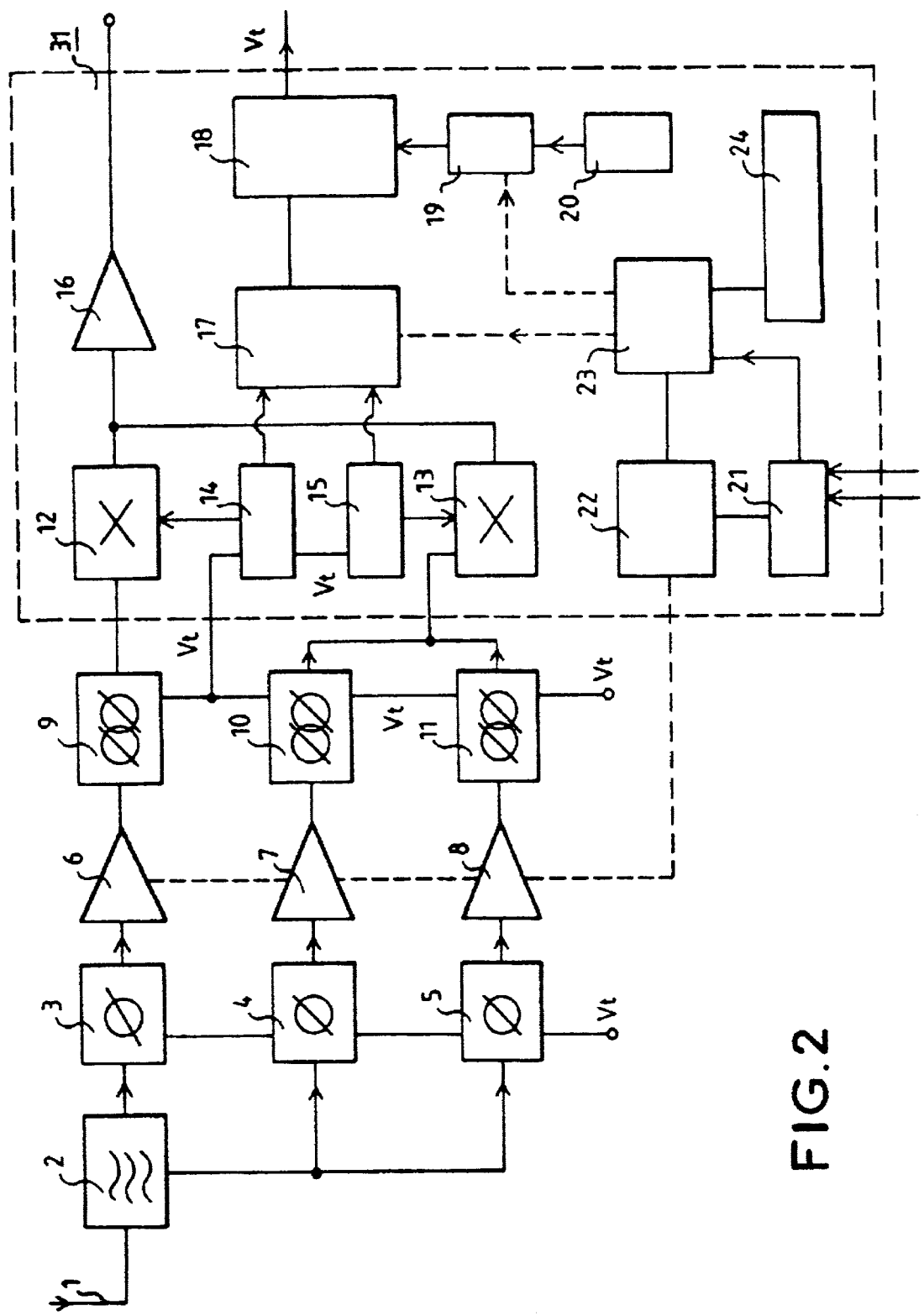
FIG. 2 is a block diagram of the tuner section shown in FIG. 1 showing an embodiment of the additional circuit according to the invention.

In a first part of this description, referring to FIG. 1, a known tuner is described, then, in relation to FIG. 2, how this known version is modified by an embodiment of the invention.

FIG. 1 is a known tuner section including a mixer-oscillator and phase lock loop integrated circuit 30. Said circuit 30 includes components 12-22 that will be described later on. The tuner includes an antenna 1, connected to IF trap and citizen band trap filter 2. The output of citizen band trap filter 2 is connected to the inputs of three input filter 3, 4, 5 for a first, a second and a third band respectively. Each of the input filter 3, 4, 5 is connected to the input of a corresponding amplifier 6, 7, 8 respectively. The output of each amplifier is fed to a corresponding double tuned band pass filter 9, 10, 11 respectively. The output of doubled tuned band pass filter 9 is fed to an UHF mixer 12, the outputs of double tuned band pass filter 10 and 11 are fed to a VHF mixer 13. Each of mixer 12, 13 receives a signal coming from a local oscillator 14, 15 respectively, and the outputs of these mixers feed an intermediate frequency amplifier 16. The intermediate frequency amplifier 16 feeds downstream circuits well known in the art and not represented. The control of the oscillating frequency is made also in a known way by means of a phase lock loop circuit (PLL). PLL circuit comprises also in a known way a first divider 17 receiving the signal from the local variable oscillators 14, 15 and output a divided frequency signal. The divided frequency signal is fed to a phase comparator and charge pump 18 that also receives a signal from a reference crystal oscillator 20. The signal from the reference crystal oscillator 20 is fed to the phase comparator 18 through a second divider 19. Generally the reference crystal oscillator 20 oscillates at a frequency of 4 MHz and the reference divider ratio equals $2^9$ or $2^5$ with or without prescalar, so that the reference frequency received in the phase comparator 18 is 7.8125 KHz or 62.5 Khz while the step size of the oscillator frequency is 62.5 KHz. The signal output from the phase comparator 18 is fed back to the oscillators 14, 15 respectively via integrated tuning voltage Vt in order to maintain the oscillating frequency. In order to settle the different components of the tuner section to the frequency chosen by a user of the receiver, data bytes are received from a microprocessor, not shown, in a bus interface 21. The bus interface 21 sends data through a data control input and output port 22 and through circuit connections represented in dotted lines to amplifiers 6, 7, 8 to disable or enable the output of one of the amplifiers, toward filters 3, 4, 5 to set the filter of the amplifier in one of a set of frequency ranges, towards oscillators 14, 15 to switch VHF or UHF oscillator 14 or 15, towards the first frequency divider 17 to input the frequency divider. The data towards the amplifier filters, the variable frequency oscillator 14, 15 is dependent upon the organisation of the circuit and may be varied from one tuner circuit to the other.

By contrast most of the frequency divider ratios (Tuning Step Size) are the same from one tuner to the other for the same operating frequency. Thus, it appeared to the inventor that what is most important in the data bytes received from the microprocessor are the data bytes giving the divider ratio for divider 17. Once this ratio is known the operating frequency is known and the other control or connection may be settled in accordance with the particular feature of the tuner which is used.

A preferred embodiment will now be described in connection with FIG. 2. In FIG. 2, components having the same function as in FIG. 1 have been given the same reference number. The preferred tuner is made with a mixer-oscillator and phase lock loop integrated circuit 31 that includes components 12 to 24.

As shown in FIG. 2, when the data from an existing software from any FST tuning chassis are received at input of the bus interface 21 with correct address bytes information, and among the data two divider data bytes 1 and 2, the divider data bytes 1 and 2 will be transferred to a N divider comparator 23 to compare with a customised band partition protocol and to predefine reference divider factors. The customised protocol is stored in a register or memory 24. The output of the comparator 23 provides the following output information data to a data control and input output ports 22 inside the tuner integrated circuit 31:

a) Frequency bandswitch (usually>2 bandswitch) & output port information b) Frequency N divider value c) Self generated control byte information The output information is obtained by reading a table giving for each range of divider values the bandwidth and output port information and the control byte information.

The table may be filled through design information exchanged between tuner designer and IC maker on frequency band partition and reference divider or may be filled through flexible design by bus programming at tuner production premises under a "production set-up mode".

For address bytes, since the four lC bus address can be chosen by hardware pins, there is no issue of its compatibility of software. The acknowledge functions remain the same.

As explained above 62.5 Khz step size is usually the standard step size in today tuners. However, in cases of a different reference crystal divider which means different tuning, an optional "selectable reference divider factor" inside the N divider comparator 23 can be activated in order to modify the value of frequency divider 19, or to only allow control byte, bit 1 and 2 (Ref. divider selection) function to receive the lC information from external lC controller to auto select tuning step size.

In the case of tuner production alignment mode "UTS" is able to disable the "OS" bit to high impedance mode for manual tuning voltage adjustment for tuner alignment.

An example of such table will be explained below. In this example, the data is given in hexa-decimal format.

Existing software protocol of Thomson world standard tuner CTT5000, tuned to CCIR channel 09 (RF freq. 203.25 Mhz, Oscillator freq.=RF+IF(38.9)=242.15 MHz) is as follows.

Data for channel 09 tuning

Address setting: C2 (tuner address hard pin—open circuit)

Divider N value: F22 (for osc. freq 242.15 MHz with step 62.5 KHz)

Control byte: 8E (operation mode, with low current tuning)

Output port: 06 (for band#2 selection, ch09 is designed in this band)

TABLE 1

Data format for ch09 tuning

| Byte | | MSB | bit #6 | bit #5 | bit #4 | bit #3 | bit #2 | bit #1 | LSB | ACK. |
|---|---|---|---|---|---|---|---|---|---|---|
| byte 1 | Address byte | 1 | 1 | 0 | 0 | 0 | MA1=0 | MA0=1 | 0 | A |
| byte 2 | Divider byte #1 | 0=0 | N14=0 | N13=0 | N12=0 | N11=1 | N10=1 | N9=1 | N8=1 | A |
| byte 3 | Divider byte #2 | N7=0 | N6=0 | N5=1 | N4=0 | N3=0 | N2=0 | N1=1 | N0=0 | A |
| byte 4 | Control byte | 1=1 | 5l=0 | T1=0 | T0=0 | 1=1 | 1=1 | 1=1 | OS=0 | A |
| byte 5 | Output port byte | U/V=0 | X | X | X | X | P2=1 | P1=1 | P0=0 | A |

X—in table 1 above means that those bits marked X are not taken in account to determine the output ports.

If tuner CTT 5000 were to be replaced by a new tuner according to the preferred embodiment and fitted with a N divider comparator, the new tuner will only respond to address and frequency divider N value and the rest of the data/information are decoded/generated by UTS (please refer to table below).

TABLE 2

Data input to UTS tuner

| Byte | | MSB | bit #6 | bit #5 | bit #4 | bit #3 | bit #2 | bit #1 | LSB | ACK |
|---|---|---|---|---|---|---|---|---|---|---|
| byte 1 | Address byte | 1 | 1 | 0 | 0 | 0 | MA0=0 | MA0=1 | 0 | A |
| byte 2 | Divider byte #1 | 0=0 | N14=0 | N13=0 | N12=0 | N11=1 | N10=1 | N9=1 | N8=1 | A |
| byte 3 | Divider byte #2 | N7=0 | N6=0 | N5=1 | N4=0 | N3=0 | N2=0 | N1=1 | N0=0 | A |
| | Control byte | 1=X | 5l=X | T1=X | T0=X | 1=X | 1=X | 1=X | OS=X | A |
| | Output port byte | U/V=X | X | X | X | X | P2=X | P1=X | P0=X | A |

X—don't care

X—don't care

If this same tuner were to replace an other tuner in a television set, the customized band partition protocol included in register 24 based on Thomson WS tuner CTT5000 with the tuning step size at 62.5 khz would be.

TABLE 3

| Freq. N divider (Hex) | N Comparator output | CTT 5000 freq chart (IF-38.9 MHz) |
|---|---|---|
| 572 to 972 | 972 ≧ N 572 = band 1 | Band 1: 48.25–112.25 MHz |
| 9E2 to 1B62 | 1B62 ≧ N ≧ 9E2 = band 2 | Band 2: 119.25–339.25 MHz |
| 1BE to 3862 | 3862 ≧ N ≧ 1BE2 = band 3 | Band 3: 407.25–863.25 MHz |

For information the Standard I$^2$ C bus data format and the Major Tuner/PLL IC manufacturing control byte data format are given in tables 4 and 5 below.

TABLE 4

Standard I$^2$ C bus data format

|  | MSB | bit #6 | bit #5 | bit #4 | bit #3 | bit #2 | bit #1 | LSB | ACK. |
|---|---|---|---|---|---|---|---|---|---|
| Address byte | 1 | 1 | 0 | 0 | 0 | MA1 | MA0 | 0 | A |
| Divider byte #1 | 0 | N14 | N13 | N12 | N11 | N10 | N9 | N8 | A |
| Divider byte #2 | N7 | N6 | N5 | N4 | N3 | N2 | N1 | N0 | A |
| Control byte | See control byte table below for details | | | | | | | | |
| Output port byte | P7 | P6 | P5 | P4 | P3 | P2 | P1 | P0 | A |

Remark: address byte & frequency divider byte #1 & 2 are universal for all RF Tuner PLL IC except control byte.

TABLE 5

Major Tuner/PLL IC manufacturing control byte data format

| Control byte (4): | MSB | bit #6 | bit #5 | bit #4 | bit #3 | bit #2 | bit #1 | LSB | ACK. |
|---|---|---|---|---|---|---|---|---|---|
| Philips: TDA640X TDA55XX | 1 | CP | T2 | T1 | T0 | RSA | RSB | OS | A |
| Siemens TDA601X, & 602X & etc. | 1 | 51 | T1 | T0 | 1 | 1 | 1 | OS | A |
| Temic U620X series | 1 | 51 | T1 | T0 | X | X | PSC | OS | A |

X—don't care

Note:
From above table shown control byte, most of the bits are only used for test mode or to enhance tuning speed and will not affect tuning step size.
(We can also write in a special protocol inside UTS when N value is in "great change" the bit 6 is activate to enhance Tuning speed.)
Except bits #1 and #2 are used for prescaler ON/OFF or to select crystal reference divider that affect tuning step size, but we can overcome this possible tuning error by selectable reference divider factor inside UTS.

X—don't care

Note:

From above table shown control byte, most of the bits are only used for test mode or to enhance tuning speed and will not affect tuning step size.

(We can also write in a special protocol inside UTS when N value is in "great change" the bit 6 is activate to enhance Tuning speed.)

Except bits #1 and #2 are used for prescaler ON/OFF or to select crystal reference divider that affect tuning step size, but we can overcome this possible tuning error by selectable reference divider factor inside UTS.

Standard bits Function:

1. LSB bit is used to disable the tuning to high impedance mode for manual tuning/test.
2. Bit 6 normally use for high or low charge pump for different tuning speed.
3. Bits 3,4 & 5 are used for IC / production test mode.
4. Bits 2 & 1 are used to select different tuning step size by changing crystal reference divider or Prescaler ON/OFF.

TABLE 6

Control byte 4, bit #2 and bit #1 function

| | | without prescarer | | with ÷ 8 prescaler | |
|---|---|---|---|---|---|
| RSA | RSB | Ref. divider | Step size | Ref divider | Step size |
| X | 0 | 80 | 50 KHz | 640 | 50 KHz |
| 0 | 1 | 128 | 31.25 KHz | 1024 | 31.25 KHz |
| 1 | 1 | 64 | 62.5 KHz | 512 | 62.5 KHz |

All step size are refer to reference crystal oscillator 4.0 Mhz.

We may summarize the invention with an embodiment as described below.

A normal Frequency Synthesiser Tuner (FST) selects a desired frequency channels by phase lock loop function inside the tuner. The tuner requires (a) frequency information by user (Table 1, N-divider byte 2 & 3), (b) frequency band partition data in terms of IC output port switching control for the particular tuner design requirement (Table 1, control byte 5), (c) operational control data for the particular tuner design requirement (Table 1, control byte 4). These external desired and internal required information received by IC transceiver (inside the tuner MOPLL IC or PLL IC) via I²C protocol bytes received from the external microprocessor controller in the receiver instrument using this tuner (Table 4 & Table 5).

A Universal Tuning Synthesiser tuner (UTS) according to the invention does not require the frequency band switching data and the operational control data (the above (b) and (c) inputs). The only required input is the user desired frequency data (above (a) input) which is independent of any tuner internal design requirement. All the required control data is completely derived internally inside the tuner itself from above (a) frequency N-divider information. The two control bytes 4 & 5 can be ignores or omitted without problem.

The UTS tuner has a logic N divider comparator (23) and a register (24) stored with predetermined frequency band partition in terms of customised-design N value (Table 3). The received frequency information in the form of N divider value (byte 2 & 3 as said above) is to be compared with the "predetermined N" value, said comparator being operable to output the intended port output and control function according to particular tuner hardware design automatically and do the right frequency band switching (e.g. band 1, band 2 & band 3 in Table 3) and control to the rest of tuner circuits to achieve a full functioning frequency synthesiser tuner.

The UTS tuner needs only user desired frequency input by N divider value from external microprocessor of the receiver instrument. It requires only 3 bytes (table 2) to be fully functional like a FST tuner as compare to normal FST tuner which requires 5 bytes (both included the standard IC address byte).

The two N-divider bytes are universal for all the tuner (the tuner with a same tuning step size of 62.5 khz) regardless of its particular hardware design while the ignored or omitted control byte 4 & 5 are non-standard data depending on individual tuner hardware design. The new developed IC software for such UTS tuner can be shorten from 5 bytes to 3 bytes protocol to improve its simplicity and achieve standardisation and compatibility. This will remove the software constraints of using a new FST tuner to replace the current one.

The UTS tuner can have flexibility to be extended to work on different tuning step size by accepting bit #2 (RSA) and bit #1 (RSB) of control byte 4 for reference divider selection bits (Table 5) while all other bits in control byte 4 are still be ignored and the control byte 5 are either ignored or omitted. As such, besides the default capability of 62.5 Khz tuning step size, step size of 31.25 khz, 50 khz or others can be selected (if required by user) via the standard practice of RSA and RSB bits setting of MOPLL or PLL I2C (Table 6).

In the UTS tuner is included and integrated into a mixer oscillator-phase lock loop integrated circuit (MOPLL IC) or tuning phase lock loop integrated circuit (PLL IC) in the tuner.

The UTS tuner according to invention will solve a software compatibility problem in applying FST tuner in receiver instrument. It creates a fully software compatibility solution to today's world standard pinning FST tuner and free the design constraints in tuner hardware design to allow full flexibility on frequency bands partition and design to deliver the best performances and cost according to its design capability, which is the intended purpose of this invention.

Hence, an existing receiver instrument with existing IC protocol software can apply a UTS tuner without any software modification to replace its existing FST tuner and be benefited in competitive cost, better performance at shorter evaluation process, and eliminated the software masking modification risk and time.

What is claimed is:

1. Tuner for receiving a video broadcast signal, comprising:
commandable circuits operable to select a tuned frequency;
a bus interface operable to receive data bytes and among those data bytes, bytes representing a divider ratio N corresponding to an input frequency by the user of the tuner; and
a N divider comparator operable to compare the value of divider ratio N received from the bus interface to values stored in a register, said comparator being operable to output control bytes and data bytes to be sent to the commandable circuits of the tuner to select a tuned frequency.

2. The tuner according to claim 1, wherein said register contains predetermined frequency band partitions in terms of customised-design N value, so as to allow the N divider comparator to output address bytes and data bytes dependent on the result of comparison to operate frequency band switching and control the commandable circuits to achieve automatical and full functioning frequency synthesiser tuning.

3. The tuner according to claim 1, wherein the achieving tuning operation, it only needs user desired frequency corresponding to the divider ratio N from an microprocessor.

4. The tuner according to claim 1, wherein said N divider comparator is bus connected to a frequency divider of a frequency output by a reference crystal oscillator.

5. The tuner according to claim 4, wherein said N divider comparator output an optional selectable reference divider factor to modify the value of the frequency divider.

6. The tuner according to claim 1, wherein said N divider comparator is included in a mixer-oscillator and phase lock loop integrated circuit.

7. An integrated circuit tuner receiving a video broadcast signal, comprising commandable circuits operable to select a tuned frequency, a bus interface operable to receive data bytes and, among those data bytes, bytes representing a divider ratio N corresponding to an input frequency by the user of the tuner; wherein said integrated circuit tuner further comprises a N divider comparator operable to compare the value of divider ratio N received from the bus interface to values stored in a register, said comparator being operable to output control bytes and data bytes to be sent to the commandable circuits to select a tuned frequency.

* * * * *